United States Patent
Wu et al.

(10) Patent No.: US 6,949,806 B2
(45) Date of Patent: Sep. 27, 2005

(54) ELECTROSTATIC DISCHARGE PROTECTION STRUCTURE FOR DEEP SUB-MICRON GATE OXIDE

(75) Inventors: Yi-Hsun Wu, Hsin-Chu (TW); Jian-Hsin Lee, Hsin-Chu (TW); Tongchern Ong, Chung-Ho (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/687,314

(22) Filed: Oct. 16, 2003

(65) Prior Publication Data

US 2005/0082619 A1 Apr. 21, 2005

(51) Int. Cl.[7] .............................................. H01L 29/76
(52) U.S. Cl. ....................... 257/412; 257/361; 257/388; 257/485; 257/576; 257/587; 438/585; 438/587; 438/588; 438/592
(58) Field of Search .................................. 257/361, 377, 257/382–384, 388, 412, 413, 407, 454–456, 485, 486, 576, 587, 751, 754–757, 768–770; 438/309, 300, 585, 587, 588, 592, 48, 92, 570, 575, 580–583, 348, 627, 643, 653, 927, 630, 647–650, 655–657, 683, 685

(56) References Cited

U.S. PATENT DOCUMENTS

| | | | | |
|---|---|---|---|---|
| 6,329,287 B1 | * | 12/2001 | Gadepally | 438/674 |
| 6,373,109 B1 | * | 4/2002 | Ahn | 257/384 |
| 2002/0053704 A1 | * | 5/2002 | Avery et al. | 257/361 |
| 2002/0130366 A1 | * | 9/2002 | Morishita | 257/360 |

OTHER PUBLICATIONS

URL: http://www.eedesign.com/article/showArticle.jhtml?articled=16503875; Verhaege, Koen G., ESD Process Shrinks I/Os Along Core Path, Nov. 6, 2001, 4 pages, CMP Media LLC., Nov. 1, 2001, Issue #13149, p. 22.

* cited by examiner

Primary Examiner—Nathan J. Flynn
Assistant Examiner—Scott R Wilson
(74) Attorney, Agent, or Firm—Haynes and Boone, LLP

(57) ABSTRACT

The present disclosure provides a deep submicron electrostatic discharge (ESD) protection structure for a deep sub-micron integrated circuit (IC) and a method for forming such a structure. The structure includes at least two electrodes separated by a dielectric material, such as a thin gate oxide layer. In some examples, the thin gate oxide may be less than 25 Å thick. A source and drain are positioned proximate to and on opposite sides of one of the electrodes to form a channel. The drain is covered with a silicide layer that enhances the ESD protection provided by the structure. The source may also be covered with a silicide layer. In some examples, the drain may be floating.

23 Claims, 6 Drawing Sheets

ELECTROSTATIC DISCHARGE PROTECTION STRUCTURE FOR DEEP SUB-MICRON GATE OXIDE

CROSS-REFERENCE

The present application is related to U.S. patent application Ser. No. 10/694,129, filed on Oct. 27, 2003, entitled "DECOUPLING CAPACITOR."

BACKGROUND

The present disclosure relates generally to integrated circuit devices and, more particularly, to electrostatic discharge protection structures for integrated circuit devices.

Integrated circuit (IC) devices are vulnerable to electrostatic discharge (ESD) damage. An ESD is generated by a high field potential, which causes 'charge-and-discharge' events (e.g., a rapid flow of electrons between two bodies of unequal charge or between one charged body and ground, with an electronic circuit being the path of least resistance between the two). An ESD may damage an IC by causing leakage currents or functional failures, and may even destroy an IC.

Various ESD simulation models exist, including the Human Body Model (HBM) and the Machine Model (MM). Since the human body has a charge-storage capacitance and a highly conductive sweat layer, the discharge from a person's touch may be simulated with the HBM using a resistor-capacitor (or RC) circuit. A IC device should generally survive an ESD of 2000V or higher with the HBM. The MM uses an ESD simulation test based on a discharge network consisting of a charged capacitor and (nominally) zero ohms of series resistance to approximate the electrostatic discharge from a machine. An IC device should generally survive an ESD of 200V or higher with the Machine Model.

The reliability challenge presented to ICs by an ESD is complicated by the shallower junction and relatively thin gate oxide used in metal oxide semiconductor field effect transistor (MOSFET) devices. This is particularly true as IC materials and fabrication processes enable the fabrication of ICs using deep sub-micron complementary MOS (CMOS) technologies. Generally, to sustain a reasonable ESD stress in submicron CMOS ICs, ESD protection circuits are added to the ICs. In order to sustain the desired ESD voltage levels, a conventional ESD protection circuit design may use an n-type MOS transistor with a resist-protection-oxide (RPO) layer. The RPO layer blocks silicidation (e.g., an anneal that results in the formation of a low resistance metal-Si alloy that acts as a contact) on the drain region to enhance ballasting resistance for an ESD protection circuit.

To further enhance ESD protection, the channel width of ESD protection devices may be designed with larger dimensions so that more ESD current can be discharged. However, if the current does not flow through the channel uniformly (e.g., if no uniform turn-on effect occurs), a larger channel width may not provide additional protection. This may be a problem in both single and multiple finger devices. For example, if current flows through only a portion of a wider drain of a single fingered device, then the IC may be destroyed even though the drain is relatively wide. In an ESD protection device implemented using multiple fingers, damage may occur if some of the fingers fail to turn on. The failure of some fingers to turn on increases the current through the remaining fingers and may destroy the associated IC.

Accordingly, what is needed is an improved ESD protection structure for IC devices.

SUMMARY

In one embodiment, a deep submicron electrostatic discharge (ESD) protection structure is provided. The structure comprises first and second electrodes separated by a dielectric material, a source positioned proximate to the first electrode, and a drain positioned proximate to the first electrode and covered by a silicide layer. The silicide layer enhances ESD protection provided by the structure.

In another embodiment, a deep submicron ESD protection structure for a deep submicron integrated circuit is provided. The structure comprises a first finger, a second finger, a drain, and a silicide layer. The first finger has first and second electrodes separated by a thin oxide material, and a first source positioned proximate to the first electrode. The second finger has third and fourth electrodes separated by a thin oxide material, and a second source positioned proximate to the third electrode. The drain is positioned proximate to the first and third electrodes, and separated from the first source by the first electrode and from the second source by the third electrode. The silicide layer is in direct contact with the drain.

In yet another embodiment, a method for fabricating a deep submicron electrostatic discharge structure is provided. The method comprises forming a well region and forming a thin gate oxide layer above the well region. A polysilicon gate structure is formed above the gate oxide layer. A source region is formed proximate to the gate oxide layer and a drain region is formed proximate to the gate oxide layer and opposite the source region. A silicide layer is formed over the drain region.

DETAILED DESCRIPTION

Figure 1:
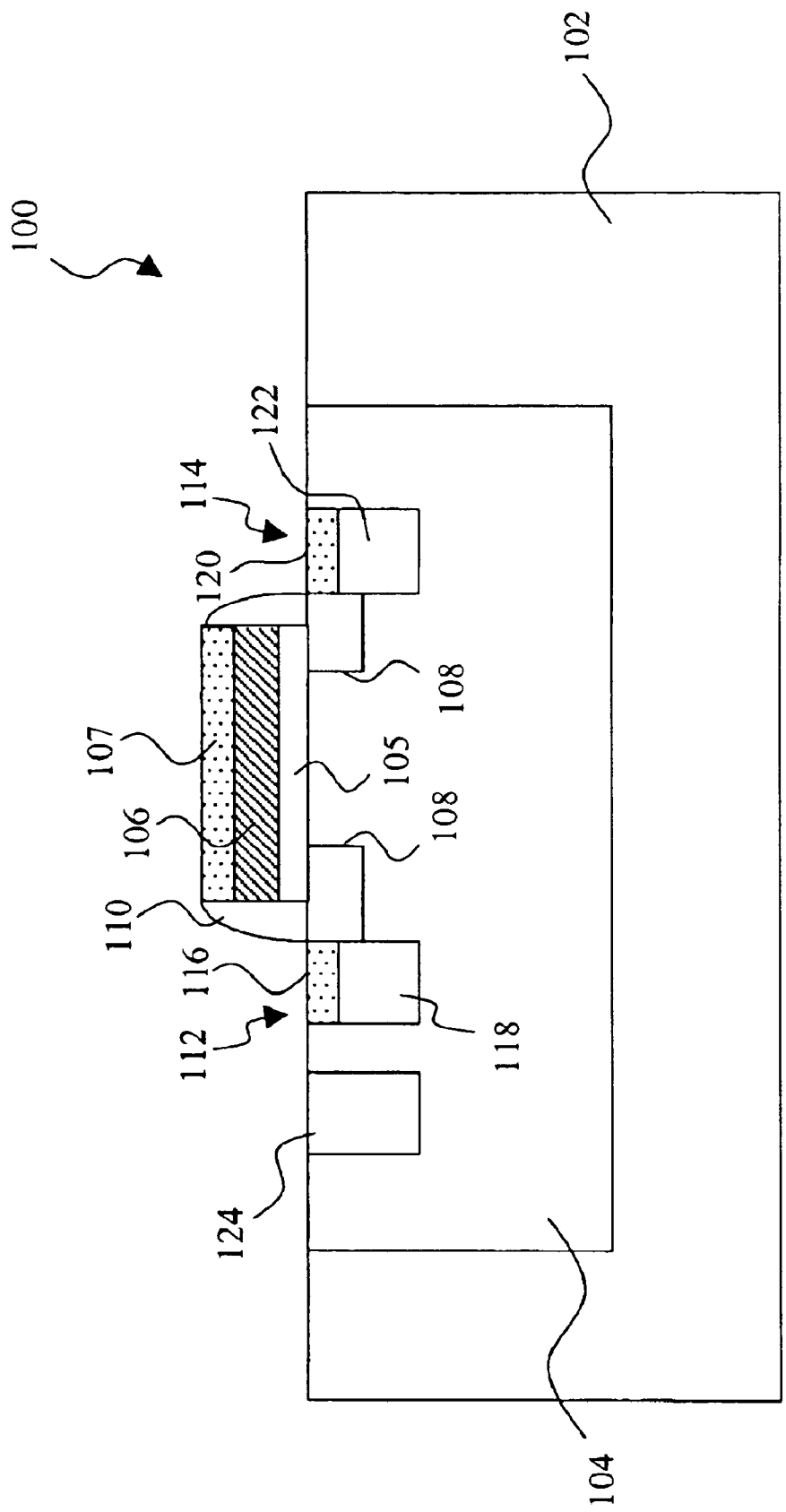
FIG. 1 is a cross-sectional view of one embodiment of an electrostatic discharge protection structure with a fully silicide source and drain.

The present disclosure relates generally to integrated circuit devices and, more particularly, to electrostatic discharge protection structures for integrated circuit devices. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Electrostatic discharge (ESD) protection in an n-channel metal oxide semiconductor field effect transistor (NMOSFET) is generally based on the NMOSFET's snap-back mechanism, which enables the NMOSFET to conduct a high level of ESD current between its drain and source. This occurs when a strong electric field across the depletion region in the drain substrate junction becomes high enough to begin avalanche breakdown, which in turn causes impact ionization, resulting in the generation of both minority and majority carriers. The minority carriers flow toward the drain contact, and the majority carriers flow toward the substrate/p-well contact, causing a local potential build up across the current path in the p-well substrate. When the local substrate potential is approximately 0.6 V higher than an adjacent n+ source potential, the source junction becomes forward biased. The forward biased source junction then injects minority carriers (electrons) into the p-well, and these carriers eventually reach the drain junction to further enhance the impact ionization effect. Eventually, the NMOSFET reaches a low impedance (snap-back) state, which enables it to conduct a large amount of ESD current.

To enhance the ESD protection capabilities of a MOSFET device, it is desirable to have a rapid turn on with a high degree of uniformity throughout the device. One technique for accomplishing this utilizes a multi-gate-finger configuration of reduced length polysilicon gate fingers to speed up the gate signal propagation and to increase the effective gate width. However, in a typical multi-gate-finger NMOS structure, not all the polysilicon gate fingers may turn on during an ESD event. That is, when the first few gate fingers reach their snap-back low impedance mode, the drain terminal to source terminal voltage is reduced to a value, called the snap-back voltage, which is less than the trigger voltage of the NMOS device. This has the effect of preventing the remaining gate fingers from being turned on. As a result, only a partial number of the gate fingers are available to absorb the ESD energy. Therefore, the ESD protection provided by the NMOSFET is significantly reduced.

As will be described in greater detail in the following text and associated figures, using fully silicide drain and/or source regions may provide improved snap-back performance in a deep submicron integrated circuit (IC). This improved performance may be due to the junction between the drain region and the channel region exhibiting an abrupt junction breakdown behavior at a relatively low first breakdown voltage. In addition, the presence of the fully silicide drain region may reduce the source region barrier, thereby lowering the holding voltage and increasing ESD event survival expectancy.

Referring to FIG. 1, a device 100 illustrates one embodiment of an IC device with enhanced ESD protection. In the present example, the device 100 comprises a deep submicron single-fingered negative-channel MOS (NMOS) structure, although it is understood that a positive-channel MOS (PMOS) structure may also be used, and that the device 100 may be used in a multi-fingered structure.

The device 100 includes an N doped substrate 102. An isolation layer (not shown) is formed in the substrate 102 to electrically isolate device areas. A well region 104 may be formed by ion implantation (although use of a P doped substrate may negate the need for a well region). For example, the well region 104 may be formed by growing a sacrificial oxide on the substrate 102, opening a pattern for the location of the well, and then using a chained-implantation procedure, as is known in the art. It is understood that the substrate 102 may have a P doped well or a combination of P and N wells.

Figure 3:
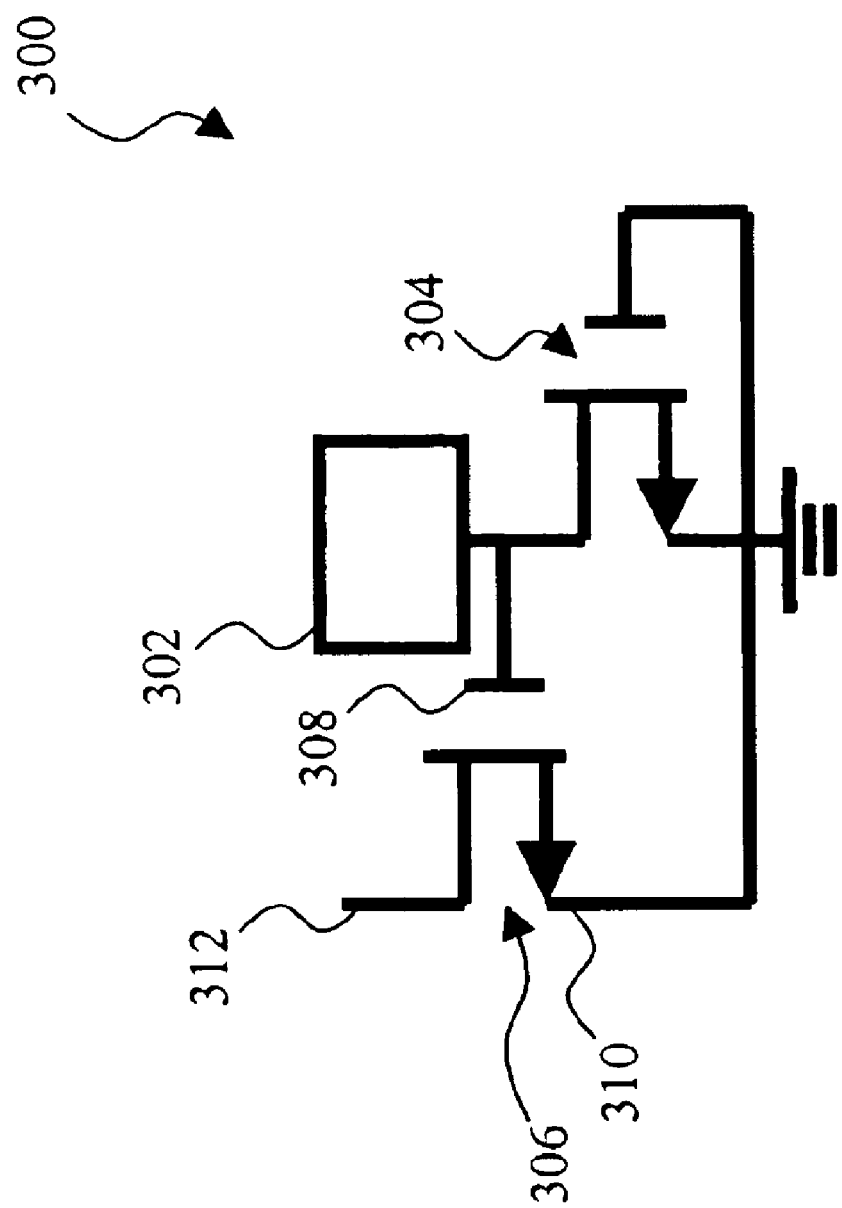
FIG. 3 is a schematic diagram of one embodiment of an I/O device using the electrostatic discharge protection structure of FIG. 2.

An ultra-thin gate oxide layer 105 may then be formed, followed by the formation of a polysilicon gate structure 106 that comprises a layer of polysilicon deposited by a process such as low pressure chemical vapor deposition (LPCVD). The polysilicon gate 106 is connected to a power source Vdd, frequently via a Vdd pad (FIG. 3). A silicide layer 107 may be deposited onto the polysilicon gate 106. The silicide layer 107 may be a metal silicide using one or more metals such as titanium, tungsten, cobalt, or nickel. Source and drain extensions (SDEs) 108 (e.g., lightly N-doped areas for a source and drain) in the well region 104 may be formed by low energy implantation or other known methods.

A spacer 110 may be formed by LPCVD by, for example, depositing an insulating material such as silicon nitride or silicon oxide. The deposited silicon nitride or silicon oxide layer may then be anisotropically etched back to form the spacer. Heavily N+ doped source and drain regions 112, 114, respectively, may be formed by ion implantation to function as source and drain contact areas. The source region 112 may comprise a silicide layer 116 over a doped area 118, and the drain region 114 may comprise a silicide layer 120 over a doped area 122. A rapid thermal annealing (RTA) step may be used to activate the implanted dopants. The source 112 may be connected to a P doped guard ring 124 and grounded.

It has been found that, in micron and submicron devices, silicidation of the source 112, drain 114, and SDE extension 108 junctions reduces ESD resistance. For example, the silicide layer 120 formed on the drain 114 may decrease the ballast resistance of the device 100 and change the current distribution in the device. To avoid this, a resist protection oxide (RPO) layer (not shown) is generally deposited on the source and drain regions 112, 114 before metal deposition. The RPO layer serves to block silicon contact with the later deposited metal and avoids the silicidation of the NMOS device. The ESD current in an NMOS without the RPO layer may be concentrated in the channel surface of the NMOS, but the use of the RPO layer for silicide-blocking moves the current away from the channel surface. Generally, the NMOS with the RPO layer can sustain a higher ESD level than that without the RPO layer. Furthermore, the NMOS without the RPO layer usually has a lower turn-on resistance than the NMOS with the RPO layer.

However, in the present example, an RPO layer is not used for the deep submicron NMOS 100 for the following reasons. With the use of ultra-thin gate oxide (e.g., thickness <25 Å) process technology in modern ICs, if the polysilicon gate structure 106 connects to a Vdd bus, the traditional power protection structure (NMOS with an RPO layer) may no longer adequately protect the ultra-thin gate oxide layer 105. For example, an NMOS at the deep submicron level with an RPO layer (and channel dimensions of length/width (L/W) 360/0.25 $\mu$m) provides protection to approximately 1500V at HBM and 75V at MM, both of which are below the desired protection levels described previously. In contrast, it has been found that an NMOS at the deep submicron level without an RPO layer (and channel dimensions of L/W 360/0.25 $\mu$m) provides protection to approximately 7500V at HBM and 350V MM. In a thin gate oxide NMOS at the deep submicron level, the use of a silicide drain may decrease the electric field near the edge of the gate oxide, which may protect the gate oxide from degradation that might occur from a stronger electric field. Accordingly, as is illustrated in FIG. 1, the device 100 is a fully silicide device (e.g., has a drain and/or source that includes or is in direct contact with a silicide layer), which improves the device's ESD resistance.

It is understood that the device 100 may be combined with other devices to form a larger ESD protection structure. For example, the device 100 may be combined in parallel with other transistors. In this case, although not shown in FIG. 1, ESD protection in the device 100 may be increased by providing a more uniform current flow across the transistors. When the transistors are combined in parallel, the current flow across all of the transistors should be balanced. This balancing may be accomplished by providing a relatively small resistance in series with the drain 114 (of each transistor). This resistance helps balance the current through the device 100 during ESD events by preventing one area of the device 100 from absorbing all of the ESD energy.

Figure 2:
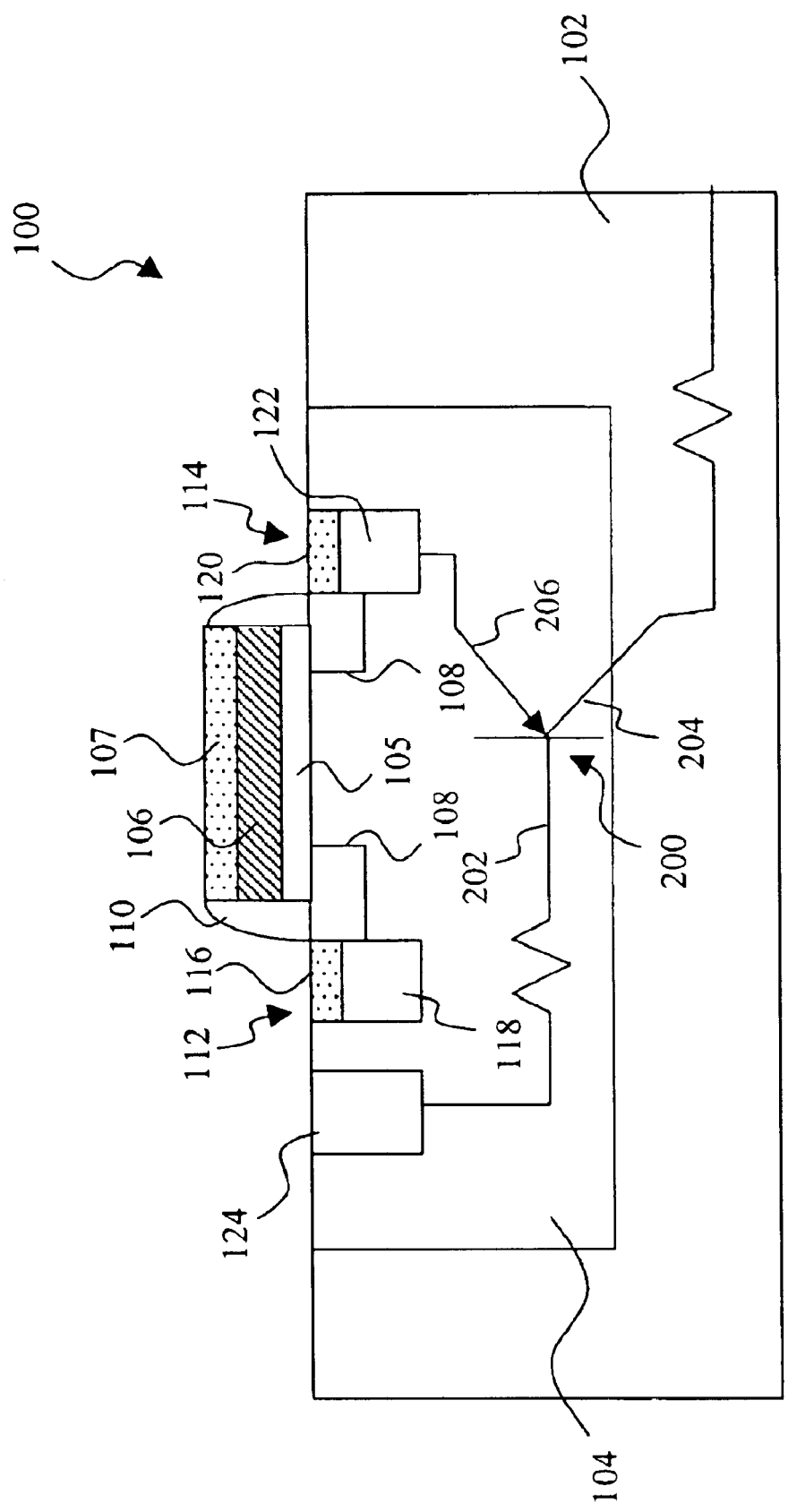
FIG. 2 is a cross-sectional view of another embodiment of an electrostatic discharge protection structure with a fully silicide source and drain, where the drain is floating.

Referring now to FIG. 2, alternative or additional ESD protection may be provided in the device 100 of FIG. 1 by letting the drain 114 float. A parasitic element 200, illustrated as a PNP bipolar junction transistor (BJT) with a base 202, collector 204, and emitter 206, may exist within the device 100. The parasitic element 200 may be formed by current interactions among the N+ drain 114, the P guard ring 124, and another heavily doped N+ area (not shown), which may be a source (such as the source 112) for a second transistor. The nature of parasitic BJT snapback (e.g., a negative differential resistance regime) may present undesired effects in both single and multi-finger devices. If the NMOS structure is incorrectly designed, an arbitrary finger (in a multi-fingered device) may be triggered into voltage snapback. This drives all current through that finger, rather than distributing the current through each of the fingers. If the current going through the finger is high enough, it may result in failure due to early local current collapse accompanied by filamentation and thermal runaway.

The use of a floating drain provides the parasitic element 200 with a constant potential region at the base 202. This reduces the thin oxide electric field near the polysilicon gate 106 and also reduces the tunnel current, resulting in decreased Vdd pad ESD susceptibility. Furthermore, the constant potential region appears to help distribute the current more evenly through the fingers of a multi-fingered device during snapback. Accordingly, the use of the floating drain 114 may provide the device 100 with additional ESD resistance.

It is understood that, to improve the turn-on uniformity in a multiple finger device, the use of a gate-driven design or a substrate-triggered design may increase ESD robustness of a large-device-dimension NMOS. However, ESD robustness of the gate-driven NMOS may decrease when the gate voltage is somewhat increased. This is may be due in part to a large ESD current discharging through the strong-inversion channel of the NMOS, which may burn out the NMOS. However, with the substrate-triggered design, the parasitic lateral BJT of the MOSFET may sustain higher ESD current than the gate-driven MOSFET.

An NMOS (or PMOS) ESD protection circuit may be used in a number of applications. For example, one application in which an NMOS may be used to provide ESD protection involves driving an output voltage for an external device. In this application, the gate of the NMOS is connected to an input drive signal. In another application, an NMOS may be used as an ESD protection device for an input pin or a power bus, with the gate of the NMOS electrically connected to ground.

Referring now to FIG. 3, in another embodiment, a structure 300 illustrates one implementation of the device 100 of FIG. 2. The structure 300 includes a Vdd pad 302, a MOS transistor 304 as a I/O output, and a fully silicide MOS transistor 306 (such as the device 100 of FIG. 2). The fully silicide transistor 306 includes a gate 308 connected to Vdd, a fully silicide source 310 connected to ground, and a fully silicide drain 312. The gate oxide is less than 25 Å. In the present example, the drain 312 is floating, as described previously with respect to FIG. 2.

It is understood that various IC layout parameters may affect the robustness of an ESD protection circuit associated with a MOS device. Some relevant layout parameters include channel width (W), channel length (L), clearance from a contact to a polysilicon-gate edge at drain and source regions, spacing between the drain and the guarding regions, and finger width. Accordingly, the layout parameters, including the exemplary channel dimensions and gate oxide thicknesses provided in the present disclosure, may be altered in order to modify the ESD protection behavior of the device associated with the parameters.

Figure 4:
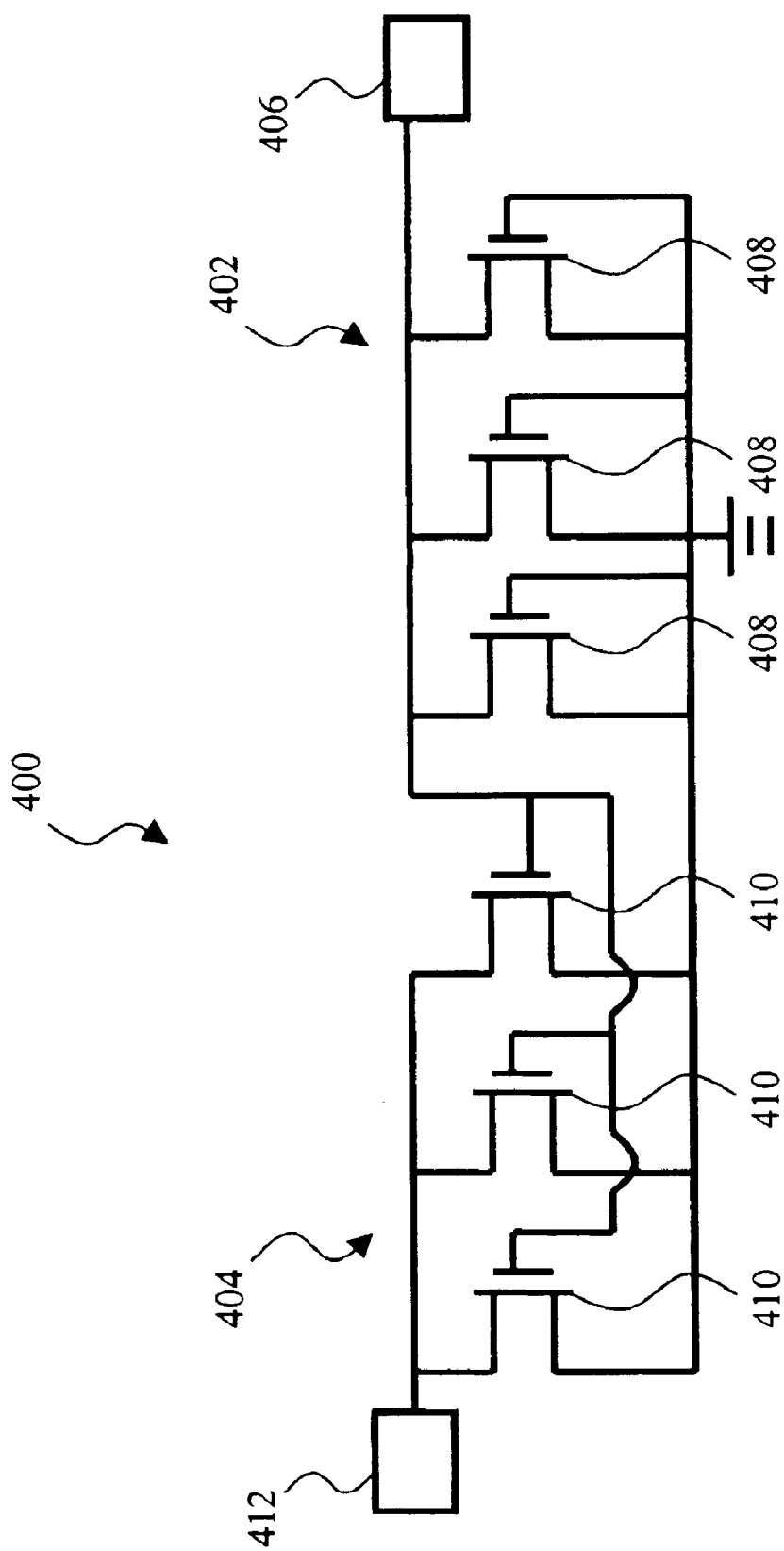
FIG. 4 is a schematic diagram of another one embodiment of an I/O device with an electrostatic discharge protection structure.

Referring now to FIG. 4, in yet another embodiment, a structure 400 includes an I/O portion 402 and an ESD protection portion 404. The I/O portion 402 includes a voltage pad (Vdd) 406 and three parallel NMOS transistors 408. The ESD protection portion 404 includes three fully silicide grounded-gate NMOS transistors 410 and a floating pad (Vss) 412. The drain of each of the NMOS transistors 410 is connected to the floating pad 412 for enhanced ESD protection as previously described. In the present example, each of the NMOS transistors 410 have a channel length/width (L/W) ratio of approximately 900/0.25 µm and a thin gate oxide of less than 25 Å. As described with respect to FIG. 1, a relatively small resistance maybe placed in series with the drain of each NMOS transistor 410 to balance the current flowing through the ESD protection portion 404.

Figure 5:
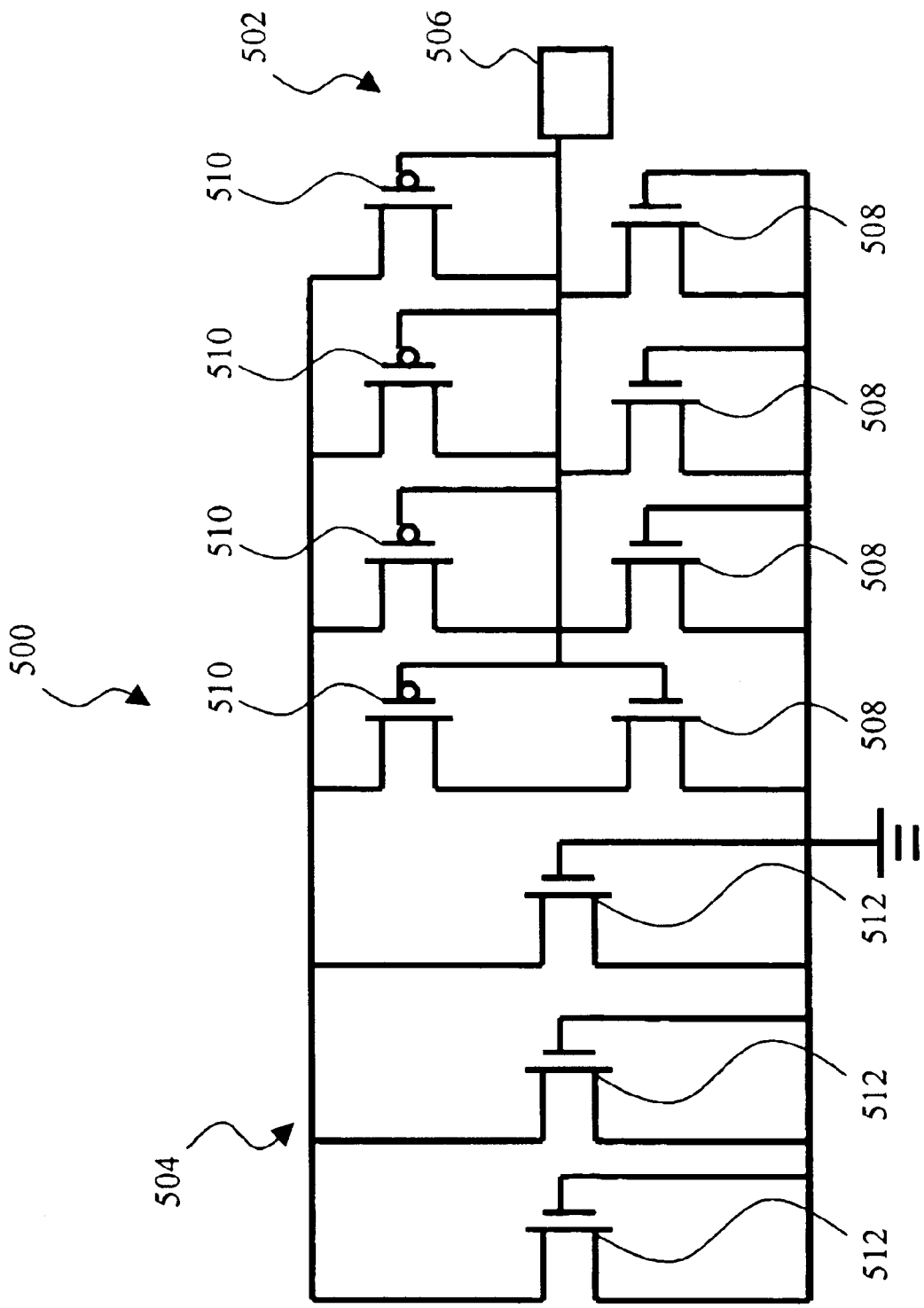
FIG. 5 is a schematic diagram of still another embodiment of an I/O device with an electrostatic discharge protection structure.

Referring now to FIG. 5, in still another embodiment, a structure 500 includes an I/O portion 502 and an ESD protection portion 504. The I/O portion 502 includes a voltage pad (Vdd) 506, four parallel NMOS transistors 508, and four parallel PMOS transistors 510. The ESD protection portion 504 includes three fully silicide grounded-gate NMOS transistors 512. In the present example, each NMOS transistor has channel dimensions of approximately L/W 900/0.25 µm, and each PMOS transistor has channel dimensions of approximately L/W 20/0.18 µm, with a thin gate oxide of less than 25 Å.

Figure 6:
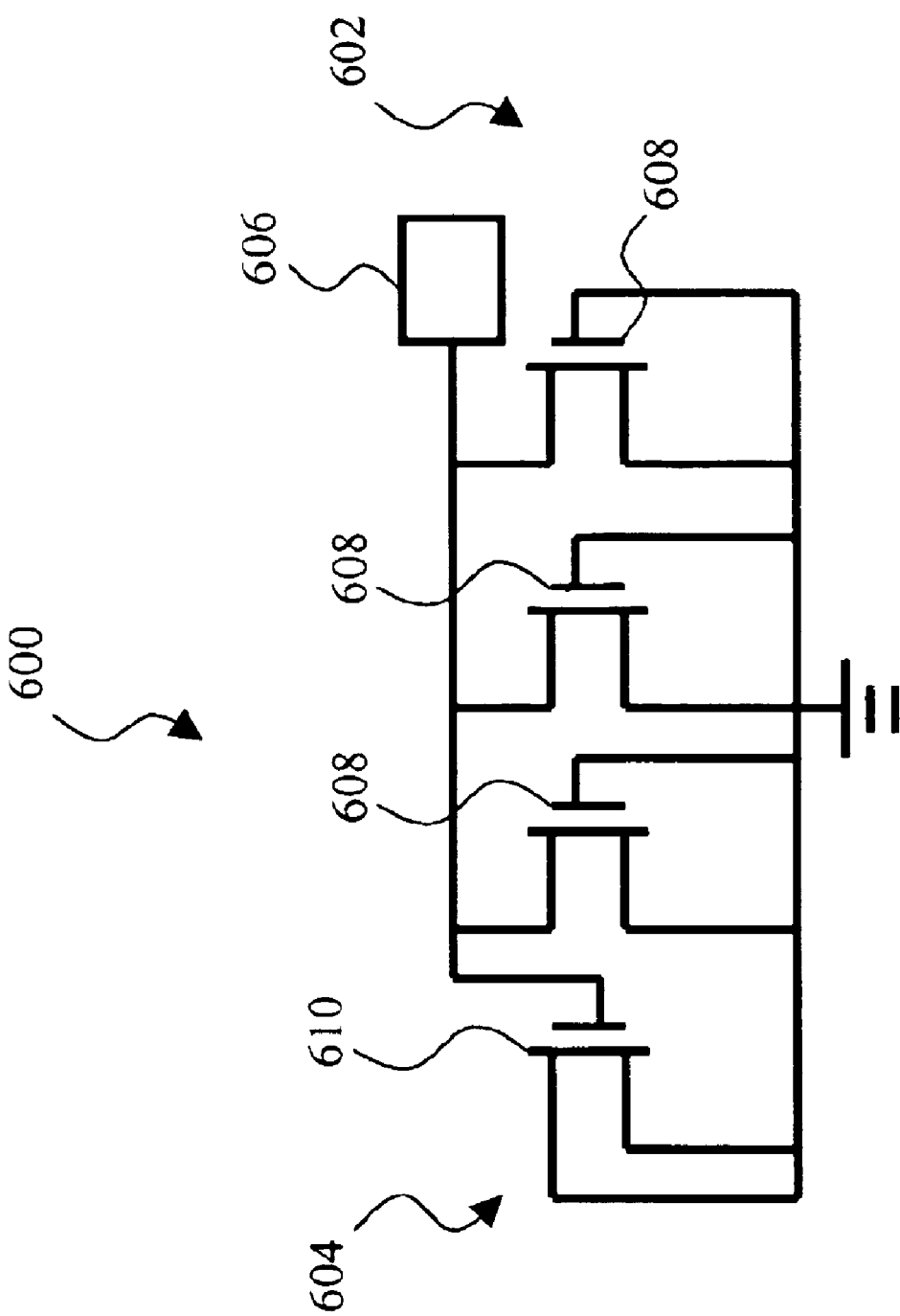
FIG. 6 is a schematic diagram of yet another embodiment of an I/O device with an electrostatic discharge protection structure.

Referring now to FIG. 6, in another embodiment, a structure 600 includes an I/O portion 602 and an ESD protection portion 604. The I/O portion 602 includes a voltage pad (Vdd) 606 and three parallel NMOS transistors 608. The ESD protection portion 604 include a fully silicide NMOS transistor 610, which has its gate connected to the voltage pad 606. In the present example, each NMOS transistor has channel dimensions of approximately L/W 900/0.25, and each PMOS transistor has channel dimensions of approximately L/W 0.25/0.25, with a thin gate oxide of less 25 Å.

In another yet embodiment, a multi-fingered deep submicron ESD protection structure includes at least two fingers. In the present example, the fingers share a drain, but it is understood that the fingers may each have a separate drain. The first finger has first and second electrodes that are separated by a thin dielectric material, such as an oxide. A first source is positioned proximate to the first electrode. The second finger has third and fourth electrodes separated by a thin dielectric material, such as an oxide. A second source is positioned proximate to the third electrode. The shared drain is covered by a silicide layer, and is positioned proximate to the first and third electrodes and separated from the first source by the first electrode and from the second source by the third electrode. As described previously, the silicide layer enhances the ESD protection afforded by the structure and shortens the transition time from breakdown to snapback While the invention has been particularly shown and described with reference to a few exemplary embodiments thereof, it will be understood by those skilled in the art that various changes in form and detail may be made therein without departing from the spirit and scope of the invention. For example, various parameters may be altered with respect to a given NMOS or PMOS transistor's layout to modify the transistor's behavior. Furthermore, multiple transistors may be combined in a variety of ways to form an ESD protection structure. For example, multiple transistors may be used in parallel or in series, and some components, such as drains, may be shared by two or more transistors. Therefore, the claims should be interpreted in a broad manner, consistent with the present invention.

What is claimed is:

1. A deep submicron electrostatic discharge (ESD) protection structure comprising:
    first and second electrodes separated by an ultra thin oxide material;
    a silicide covered, grounded gate positioned above the ultra thin oxide material;
    a source positioned proximate to the first electrode; and
    a floating drain positioned proximate to the second electrode and covered by a silicide layer, wherein the silicide layer enhances ESD protection provided by the structure.

2. The structure of claim 1 wherein the ultra thin oxide material comprises a thin oxide layer of less than 25 Å.

3. The structure of claim 1 wherein the silicide layer is a metal silicide.

4. The structure of claim 3 wherein the metal silicide is formed using at least one of titanium, tungsten, cobalt, and nickel.

5. The structure of claim 1 wherein the structure is an n-channel metal oxide semiconductor field effect transistor.

6. The structure of claim 1 wherein the structure is a p-channel metal oxide semiconductor field effect transistor.

7. The structure of claim 1 wherein the structure is associated with a transition time from breakdown to snapback, and wherein the silicide layer shortens the transition time.

8. A deep submicron electrostatic discharge (ESD) protection structure comprising:
    first and second electrodes separated by a thin oxide material, wherein the thin oxide material comprises a thin oxide layer of less than 25 Å;
    a source positioned proximate to the first electrode, wherein the first electrode forms a channel with a length of approximately 900 µm and a width of approximately 0.25 µm; and
    a drain positioned proximate to the second electrode and covered by a silicide layer, wherein the silicide layer enhances ESD protection provided by the structure.

9. A deep submicron electrostatic discharge (ESD) protection structure comprising:
    first and second electrodes separated by a thin oxide material;
    a source positioned proximate to the first electrode; and
    a drain positioned proximate to the second electrode and covered by a silicide layer, wherein the silicide layer enhances ESD protection provided by the structure; and wherein the drain is floating, and wherein the floating drain modifies the ESD protection provided by the structure.

10. The structure of claim 9 further comprising a parasitic element formed by current interactions between the source, the floating drain, and a doped area.

11. The structure of claim 10, wherein the parasitic element functions as a bipolar junction transistor (BJT), and wherein the floating drain provides a constant potential region at the base of the BJT.

12. A deep submicron electrostatic discharge (ESD) protection structure for a deep submicron integrated circuit, the structure comprising:
    a first finger having first and second electrodes separated by a thin oxide material, a first silicide covered, grounded gate positioned above the thin oxide material, and a first source positioned proximate to the first electrode; and
    a second finger having third and fourth electrodes separated by a thin oxide material, a second silicide covered, grounded gate positioned above the thin oxide material, and a second source positioned proximate to the third electrode;
    a drain positioned proximate to the first and third electrodes, and separated from the first source by the first electrode and from the second source by the third electrode; and
    a silicide layer in direct contact with the drain.

13. The structure of claim 12 wherein the thin oxide material is less than 25 Å thick.

14. The structure of claim 12 wherein the silicide layer is a metal silicide.

15. The structure of claim 14 wherein the metal suicide is formed using at least one of titanium, tungsten, cobalt, and nickel.

16. The structure of claim 12 wherein the silicide layer shortens a transition time of the structure from breakdown to snapback.

17. A deep submicron electrostatic discharge (ESD) protection structure for a deep submicron integrated circuit, the structure comprising:
    a first finger having first and second electrodes separated by a thin oxide material, and a first source positioned proximate to the first electrode; and
    a second finger having third and fourth electrodes separated by a thin oxide material, and a second source positioned proximate to the third electrode;
    a drain positioned proximate to the first and third electrodes, and separated from the first source by the first electrode and from the second source by the third electrode, wherein at least one of the first and third electrodes forms a channel with a length of approximately 900 µm and a width of approximately 0.25 µm; and
    a silicide layer in direct contact with the drain.

18. A method for fabricating a deep submicron electrostatic discharge structure, the method comprising:
    forming a well region;
    forming a thin gate oxide layer above the well region;
    forming a suicide covered, grounded polysilicon gate structure above the gate oxide layer;
    forming a source region proximate to the gate oxide layer;

forming a drain region proximate to the gate oxide layer and opposite the source region; and forming a silicide layer over the drain region, wherein the drain region is floating.

19. The method of claim 18 wherein forming the thin gate oxide layer includes depositing an oxide of less than 25 Å thick.

20. The method of claim 18 wherein forming the suicide layer includes laying down a metal silicide using at least one of titanium, tungsten, cobalt, and nickel.

21. The method of claim 18 further comprising forming a suicide layer over the source region.

22. The method of claim 18 further comprising covering the polysilicon gate structure, the source region, and the drain region with a thin oxide layer; and forming, through the thin oxide layer, a first interconnection to the source region and a second interconnection to the polysilicon gate structure, while leaving the thin oxide layer above the drain region intact, wherein the drain region is not connected to an interconnection.

23. A deep submicron electrostatic discharge (ESD) protection structure comprising:

a plurality of n-channel metal oxide semiconductors in a multi-finger configuration, wherein each finger comprises one of the n-channel metal oxide semiconductors, and wherein each n-channel metal oxide semiconductor has:

a thin oxide layer formed on a substrate;

a silicide covered, grounded gate positioned on the thin oxide layer;

a silicide covered source positioned proximate to the thin oxide layer on one side of the grounded gate; and a silicide covered drain positioned proximate to the thin oxide layer on the side of the grounded gate opposite the source.

\* \* \* \* \*

UNITED STATES PATENT AND TRADEMARK OFFICE
CERTIFICATE OF CORRECTION

PATENT NO. : 6,949,806 B2
DATED : September 27, 2005
INVENTOR(S) : Yi-Hsun Wu et al.

It is certified that error appears in the above-identified patent and that said Letters Patent is hereby corrected as shown below:

Column 8,
Lines 36 and 63, "suicide" should read -- silicide --.

Column 9,
Lines 8 and 12, "suicide" should read -- silicide --.

Signed and Sealed this

Twenty-first Day of March, 2006

JON W. DUDAS
*Director of the United States Patent and Trademark Office*